United States Patent
Henshaw et al.

(10) Patent No.: US 7,072,625 B2
(45) Date of Patent: Jul. 4, 2006

(54) ANTENNA CIRCUITRY

(75) Inventors: Robert Astle Henshaw, Herts (GB); David Freeborough, Herts (GB); Patrick Wurm, Herts (GB)

(73) Assignee: TTPCOM Limited, Melbourn Royston (GB)

( * ) Notice: Subject to any disclaimer, the term of this patent is extended or adjusted under 35 U.S.C. 154(b) by 303 days.

(21) Appl. No.: 10/191,791

(22) Filed: Jul. 9, 2002

(65) Prior Publication Data

US 2003/0013422 A1    Jan. 16, 2003

(51) Int. Cl.
*H01Q 11/12*   (2006.01)
*H04B 1/04*   (2006.01)

(52) U.S. Cl. ........... 455/126; 455/127.1; 455/277.1; 455/550.1

(58) Field of Classification Search ........... 455/129, 455/127.2, 127.3, 126, 78, 82, 80, 84, 133, 455/132, 69, 522, 90.2, 277.1, 280, 127.1, 455/127.5, 276.1, 66.1, 67.11, 550.1, 575.5, 455/101, 108, 121; 343/860; 330/278

See application file for complete search history.

(56) References Cited

U.S. PATENT DOCUMENTS

| 5,278,996 | A |   | 1/1994 | Shitara |   |
|---|---|---|---|---|---|
| 5,822,684 | A | * | 10/1998 | Kitakubo | 455/78 |
| 5,909,643 | A |   | 6/1999 | Aihara |   |
| 5,933,767 | A | * | 8/1999 | Leizerovich et al. | 455/126 |
| 6,366,764 | B1 | * | 4/2002 | Yang et al. | 455/73 |
| 6,765,540 | B1 | * | 7/2004 | Toncich | 455/82 |
| 2002/0086643 | A1 | * | 7/2002 | Leipala | 455/80 |

FOREIGN PATENT DOCUMENTS

EP    1 011 192    6/2000

\* cited by examiner

*Primary Examiner*—Tilahun Gesesse
*Assistant Examiner*—John J. Lee
(74) *Attorney, Agent, or Firm*—Andrus, Sceales, Starke & Sawall, LLP

(57) ABSTRACT

An antenna circuit for a mobile telecommunication device. The circuit comprises a power amplifier for amplifying, in use, a signal to be transmitted. An antenna transmits signals output from the power amplifier. Switching means introduces, dependent upon the gain setting of the power amplifier, an attenuator between the output of the power amplifier and the antenna.

14 Claims, 2 Drawing Sheets

ANTENNA CIRCUITRY

CROSS REFERENCE TO RELATED APPLICATION

The present application claims priority from European Patent Application No.01305969.6, filed Jul. 11, 2001.

FIELD OF THE INVENTION

This invention relates to circuitry for use with a transmitting/receiving antenna of the type employed in mobile telecommunications.

BACKGROUND OF THE INVENTION

There is already much information readily available in relation to circuitry for mobile telecommunications, particularly in relation to mobile telephony.

One problem particularly associated with mobile telephony antenna circuitry design relates to the ability of such circuitry to pass various tests so that it meets internationally approved standards in relation to a number of criteria. One of those criteria is the so-called "blocking test". In this test, transmitting circuitry is tested in the presence of a high power blocking signal in order to simulate a situation where two people are operating simultaneously mobile communication devices using different networks, one of which is emitting at a full power (as it is far away from its base station), and the other emitting at minimum power level. Whilst in some circumstances the need to pass this test can propose considerable design constraints on transmitter circuitry, for the reasons set out below, for some data modulation formats the very nature of the modulation format makes this blocking problem a less important one. For example, current GSM telephones generally operate using GMSK data format which has a constant amplitude envelope for its transmitted signal, meaning that the separation between any received blocking signal and the intended transmitted signal is always large enough in terms of amplitude. This means that the received "blocking" signal is of a level which does not affect the power control stability of the signal sent to the antenna.

However, it has recently been proposed to employ an enhanced data format with the GSM system. This enhanced system, known as "EDGE" (enhanced data GSM environment) differs in terms of signal characteristics in many ways compared to GMSK formatting. Whilst EDGE has advantages, in terms of increased data transmission rates and efficiency of use of the GSM spectrum, it does result in a transmitting signal which is of varying amplitude envelope. Accordingly, in this situation, there are certain occasions when the signal output by an antenna employed with an EDGE format transmitting device will be relatively low, particularly in relation to any adjacent signal being transmitted at high power. This can result in instabilities being generated in the transmitting circuitry of a device employing the EDGE format, leading to breakdowns in transmission, as well as the potential for circuitry damage in extreme circumstances.

SUMMARY OF THE INVENTION

The present invention seeks to overcome this problem.

According to the present invention there is provided an antenna circuit for a mobile telecommunication device, the circuit comprising:

a power amplifier for receiving and amplifying, in use, a signal to be transmitted;

an antenna for transmitting signals output from the power amplifier; and switching means for introducing, dependent upon the gain setting of the power amplifier, an attenuator between the output of the power amplifier and the antenna.

The attenuator may attenuate the output of the power amplifier by up to 10 decibels. The circuit may further comprise power control means for controlling the output of the power amplifier via a feedback loop.

The invention also provides a mobile transmitting device, which may be a mobile telephone, which comprises the above antenna circuit.

By selectively introducing an attenuator between the output of the power amplifier and the antenna, it is possible to introduce, particularly when the power amplifier is operating at lower power output, a lossy component which ensures that any blocking signal received by the antenna and hiting the output of the power amplifier while transmitting has an amplitude at the output of the power amplifier which is always lower than the output signal from the power amplifier. This results in a discrepancy in amplitude which is sufficient to enable design of feedback power control circuitry such that it is much less affected by the blocker signal and so that it does not produce any oscillations or amplitude notch that can affect transmission quality or introduce instability into the feedback loop.

BRIEF DESCRIPTION OF THE DRAWINGS

An example of the present invention will now be described with reference to the accompanying drawings, in which.

DETAILED DESCRIPTION OF THE INVENTION

Figure 1:
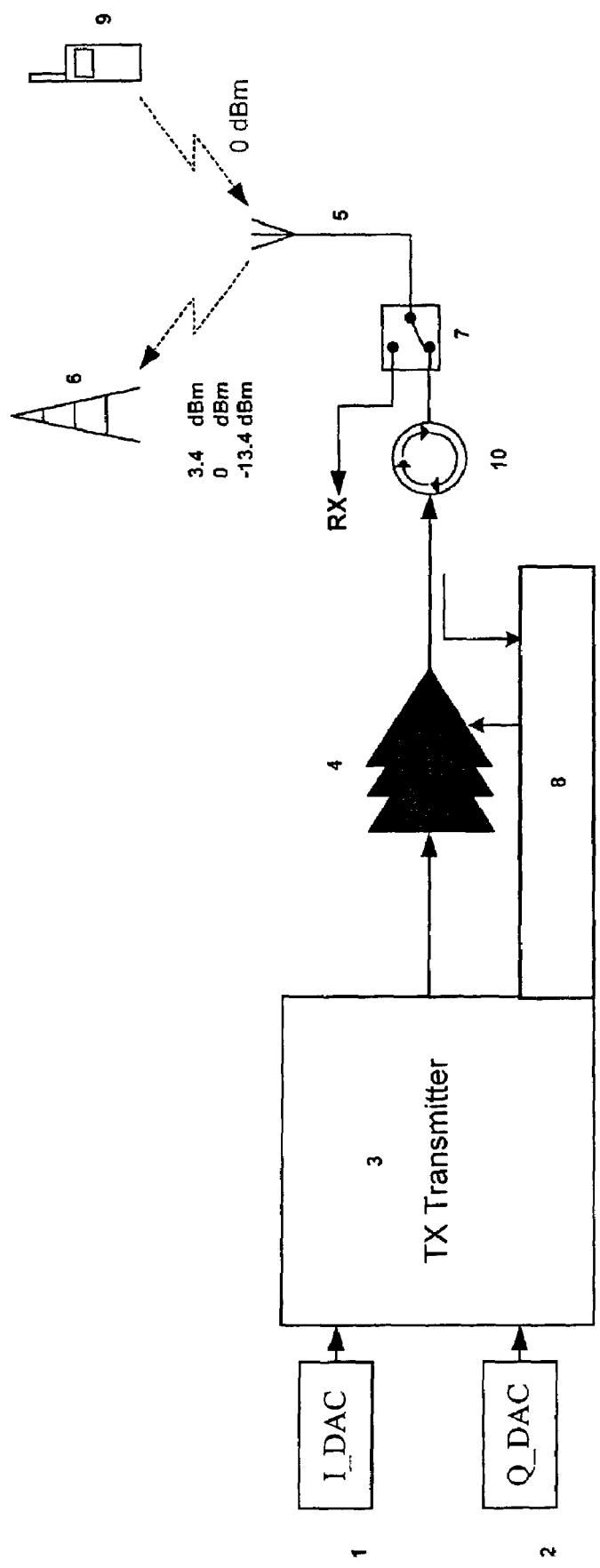
FIG. 1 is a schematic circuit diagram of a standard mobile telecommunications device with known antenna circuitry.

Referring to FIG. 1, a known antenna circuit for use in a mobile telecommunications device, such as a mobile telephone, is shown. The circuit comprises I and Q digital analogue converters 1, 2 which provide inputs to RF transmitter circuitry 3. The transmitter circuitry 3 generates an RF signal which is input to a power amplifier 4 for amplification prior to transmission. The output of the power amplifier 4 is provided to an antenna 5 so that a transmitted signal 6 can be sent to a receiving base station. In the transmission path between the output of the power amplifier 4 and the antenna 5 it is a switch 7 which can be controlled to direct the connection of the antenna 5 to a receiving circuit (not shown) when a signal is to be received by the device. Associated with the power amplifier 4 is feedback control circuitry 8 which monitors the output of the power amplifier 4 and controls the gain of the power amplifier 4 based thereon to ensure that the value of the transmitted signal from the antenna 5 is within the required standards.

Such circuitry has been employed, in general terms, in GSM mobile telephone systems that employ the GMSK telecommunication data format.

It is also possible to use such circuitry for EDGE format data signals. However, an additional isolator 10 is required to attenuate the parasitic signals received by the antenna.

Even so there are certain circumstances in which problems can occur. One such situation is the "blocking" situation described above. In this situation a blocking signal 9 is received by the antenna 5 whilst it is also transmitting. The blocking signal 9 received by the antenna passes through the switch and reaches the output of the power amplifier 4 where it is reflected and sent back in the forward (transmitting) direction. Therefore the directional coupler will sample both the transmitted signal and the reflected blocking signal into the feedback path. This will affect the power control circuitry and cause instabilities when the transmitted signal level is of much lower amplitude than the blocking signal level.

Its effect on the input to the power control means 8 and hence the feedback control of the power amplifier 4 level is small for a GMSK format signal. However, in transmission signals in accordance with the EDGE format there is a considerable variation in amplitude in the output of the power amplifier 4, typically as much as 16.8 dB. Therefore, for a blocking signal that is received at a reference value of 0 dBm RMS, and in a situation where the power amplifier 4 is transmitting at the lowest power level and for an EDGE signal which is at the lower end of the EDGE format amplitude scale, problems can occur in terms of the blocked signal being of bigger amplitude than a very significant part of the transmitted signal. This can result in inaccurate control of the output power of the power amplifier 4 to the extent that control may become unstable, producing inappropriate transmissions and plenty of data errors.

Figure 2:
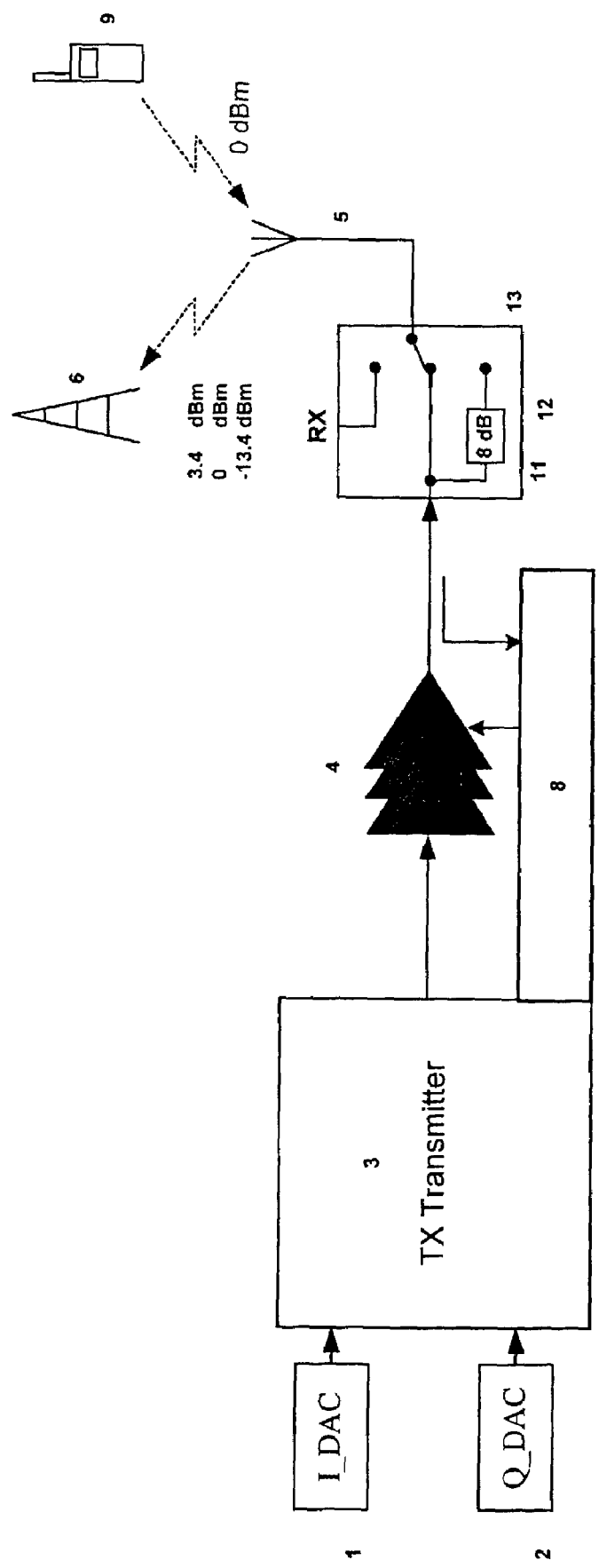
FIG. 2 is a schematic circuit diagram of antenna circuitry according to the present invention.

FIG. 2 shows the present invention in which components which correspond generally to those of FIG. 1 are numbered identically. In the circuitry of the present invention there is provided, in place of the switch 7 of the prior art, a switch 13. The switch 13 still provides the selectable transmission/reception component contained in the switch 7 of the prior art. It also contains, however, an attenuator component 11 which can be selected by appropriate control of the switch 13 from a control signal output 12. This avoids the use of a large and costly isolator 10.

In the present invention operation in most circumstances is the same as for that of the prior art. However, the provision of the attenuating current component 11 within the switch 13 provides a device which can, under certain circumstances, introduce an attenuator 11 into the transmission path between the output of the power amplifier 4 and the antenna 5. The circumstances will, to a certain extent, be dependent upon the specific characteristics of the signal that is being generated, as well as those of the power amplifier 4, antenna 5 and sensitivity of the power control circuitry 8. However, in general terms, when it is determined that the power amplifier 4 is operating at low power levels, i.e. the circumstances when a blocking signal 9 of sufficient strength could affect the stability of the power control circuitry 8, the switch 13 is operated via the input 12 to introduce the attenuation component 11 into the path. Whilst this results in the need for the output power level 8 to be increased to compensate for the additional attenuation 11, it results in attenuation of any received parasitic "blocking" signal 9 prior to it arriving at the output of the power amplifier 4. Attenuation of the received blocking signal 9 in such a manner results in its amplitude being considerably reduced by the time it reaches the output of the power amplifier 4.

Furthermore, by operating the power amplifier at a slightly higher ouput power level than would have been necessary in the prior art example of FIG. 1 the output signal is higher than in the prior art. There is a resulting separation, therefore, in amplitude terms, between the output signal from the power amplifier 4 and the blocking signal 9 seen at the output of the power amplifier 4 which is greater than that in the prior art. By appropriate control of the value of attenuation (an 8 dB value being appropriate for most EDGE format signals), the relative amplitudes of the two signals can be such that there is no significant effect on the monitoring signal received by the power circuit 8 and control loss of the power amplifier 4 is avoided. We may also indicate that operating at a slightly higher power level is not a real inconvenient as the RF transmitter is already designed to operate at the highest power levels. Therefore the difference in terms of power saving between mid-low power levels and the lowest power level is not very significant.

The invention claimed is:

1. An antenna circuit for a mobile telecommunication device, the circuit comprising:
   a power amplifier for receiving and amplifying, in use, a signal to be transmitted;
   an antenna for transmitting signals output from the power amplifier;
   a switching means; and
   an attenuator introduced by the switching means, depending upon the gain setting of the power amplifier, the attenuator configured between the output of the power amplifier and the antenna,
   wherein the attenuator is configured to reduce the amplitude of a blocking signal when the power amplifier is operating at low power levels.

2. A circuit according to claim 1, wherein the attenuator attenuates the output of the power amplifier by up to 10 decibels.

3. A circuit according to claim 2, wherein the antenna is a mobile transmitting device.

4. A device according to claim 3, wherein the device is a mobile telephone.

5. A device according to claim 3, wherein the device employs the EDGE data format or a non-constant envelope modulation scheme.

6. A device according to claim 4, wherein the device employs the EDGE data format or a non-constant envelope modulation scheme.

7. A device according to claim 5, wherein the device employs the EDGE data format or a non-constant envelope modulation scheme.

8. A circuit according to claim 1, further comprising power control means for controlling the output of the power amplifier via a feedback loop.

9. A circuit according to claim 8, wherein the antenna is a mobile transmitting device.

10. A device according to claim 9, wherein the device is a mobile telephone.

11. A device according to claim 9, wherein the device employs the EDGE data format or a non-constant envelope modulation scheme.

12. A circuit according to claim 1, wherein the antenna is for a mobile transmitting device.

13. A device according to claim 12, wherein the device is a mobile telephone.

14. A device according to claim 12, wherein the device employs the EDGE data format or a non-constant envelope modulation scheme.

* * * * *